(12) United States Patent
Curbelo et al.

(10) Patent No.: US 8,717,069 B2
(45) Date of Patent: May 6, 2014

(54) CONVERTER SWITCH APPARATUS AND METHOD

(75) Inventors: Alvaro Jorge Mari Curbelo, Bavaria (ES); Thomas Alois Zoels, Bayern (DE); Miguel Garcia Clemente, Bayern (DE); Philipp Leuner, Bayern (DE)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/454,292

(22) Filed: Apr. 24, 2012

(65) Prior Publication Data

US 2013/0278298 A1 Oct. 24, 2013

(51) Int. Cl.
*H03K 3/00* (2006.01)

(52) U.S. Cl.
USPC .......................................... 327/108; 327/112

(58) Field of Classification Search
USPC .................................. 327/108–112
See application file for complete search history.

(56) References Cited

U.S. PATENT DOCUMENTS

| | | | | |
|---|---|---|---|---|
| 5,305,191 A * | 4/1994 | Loftus, Jr. | .......................... | 363/17 |
| 5,877,646 A | 3/1999 | Jorg | | |
| 5,926,012 A * | 7/1999 | Takizawa et al. | ............. | 323/284 |
| 8,264,256 B2 * | 9/2012 | Logiudice et al. | ............. | 327/108 |
| 8,283,953 B2 * | 10/2012 | Brumett et al. | ............... | 327/109 |
| 8,362,812 B2 * | 1/2013 | Lee | ............................... | 327/109 |
| 2005/0253165 A1 | 11/2005 | Pace et al. | | |
| 2006/0044025 A1 | 3/2006 | Grbovic | | |

FOREIGN PATENT DOCUMENTS

EP 0797301 A2 9/1997

OTHER PUBLICATIONS

Search Report and Written Opinion from corresponding PCT Application No. PCT/US2013/033203 dated Jul. 18, 2013.

* cited by examiner

*Primary Examiner* — Kenneth B. Wells
(74) *Attorney, Agent, or Firm* — GE Global Patent Operation; John A. Kramer (57) ABSTRACT

A switch apparatus includes a semiconductor power switch connected for delivering current while driven by a gate drive voltage and an adaptive gate drive unit connected to a gate of the power switch. The gate drive unit is configured to select one of a plurality of pre-determined time functions for a gate drive voltage, and to deliver the gate drive voltage to the gate of the power switch according to the selected time function, thereby driving the power switch to deliver current within a pre-determined slew rate envelope.

8 Claims, 6 Drawing Sheets

CONVERTER SWITCH APPARATUS AND METHOD

BACKGROUND

1. Technical Field

Embodiments of the invention relate generally to power converters. Other embodiments relate to a switch apparatus for power converters.

2. Discussion of Art

In the rail industry, rail vehicles are utilized to transport passengers and/or cargo from location to location on a track. Typically, a locomotive provides the tractive power for a train. The locomotive is connected to pull or push the remainder of the train, and has traction wheels engaged with the track. In modern designs, the traction wheels are driven by electric wheel motors, which are powered via electrical distribution from one or more engine-driven generators housed within the locomotive. The traction wheels and wheel motors can be reversibly configured, to also act as brakes for slowing the locomotive.

Similarly, in the mining industry, large off-highway vehicles ("OHVs") usually employ electrically motorized wheels for propelling or retarding the vehicle. In particular, OHVs typically use a large horsepower diesel engine in conjunction with an alternator, a main traction inverter, and a pair of wheel drive assemblies housed within the rear tires of the vehicle. The diesel engine is directly associated with the alternator such that the diesel engine drives the alternator. The alternator powers the main traction inverter, in which semiconductor power switches commutate the alternator output current to provide electrical power to electric drive motors of the wheel drive assemblies.

In both locomotive and OHV applications, solid state power converters are used to provide high voltage current from the generators or alternators to the wheel motors. Such power converters include inductive coils to step down the voltage as well as semiconductor power switches to commutate the current. Although the above-described applications are typical, it will be appreciated that power converters can be used in other settings.

Generally, operation of a power converter is accomplished by alternately applying two different gate drive voltage levels to the gates of individual semiconductor power switches via corresponding gate drive units. The gate of each power switch is a low power terminal used to turn the switch on or off by changing the concentrations of charge carriers within the semiconductor regions. Charge carrier concentrations may be changed by depletion, or by electric field, i.e., through field-effect and depletion-effect switching. Field-effect and depletion-effect semiconductor power switches respond differently, however, to any constant value of gate drive voltage, depending on electrical parameters of the circuit in which the semiconductors are connected. As such, power converter efficiency varies across the operating ranges of electrical parameters that impact semiconductor power switch response.

Accordingly, it is desirable to maintain optimum power converter efficiency by regulating witching current slew rates.

BRIEF DESCRIPTION

According to an embodiment of the present invention a switch apparatus includes a semiconductor power switch connected for delivering current while driven by a gate drive voltage, and also includes a gate drive unit connected to a gate of the power switch. The gate drive unit is configured to select one of a plurality of pre-determined time functions for a gate drive voltage, and to deliver the gate drive voltage to the gate of the power switch according to the selected time function to drive the power switch to deliver current within a pre-determined slew rate envelope.

According to another embodiment of the present invention, a gate drive unit includes a control terminal; a logic circuit; and an output stage configured to provide a gate drive voltage for driving a semiconductor power switch. The logic circuit is configured to select a time function, based on a control signal received via the control terminal. The logic circuit is further configured to control the output stage to provide the gate drive voltage, according to the selected time function.

According to another embodiment of the present invention, a switch apparatus includes a semiconductor power switch connected to a DC link, and a gate drive unit connected to a gate of the semiconductor power switch. For at least some different DC link voltages of the DC link, the gate drive unit is configured to deliver different gate drive voltages to a gate of the semiconductor power switch. By delivering different gate drive voltages, the gate drive unit drives the semiconductor power switch to deliver current from the DC link to a load.

In another aspect, the present invention relates to a method for maintaining a current slew rate across a semiconductor power switch within a pre-defined slew rate envelope, without direct measurement of the current slew rate. The current slew rate is maintained by adjusting a gate drive voltage provided to the semiconductor power switch by a gate drive unit, based on a control signal received at the gate drive unit.

DRAWINGS

The present invention will be better understood from reading the following description of non-limiting embodiments, with reference to the attached drawings, wherein below.

DETAILED DESCRIPTION

Reference will be made below in detail to exemplary embodiments of the invention, examples of which are illustrated in the accompanying drawings. Wherever possible, the same reference characters used throughout the drawings refer to the same or like parts. Although exemplary embodiments of the present invention are described with respect to power converters, embodiments of the invention are also applicable for use with small semiconductor power switches.

Embodiments of the invention relate to adaptive gate drive units that adjust semiconductor power switch gate drive voltage to maintain a current slew function consistent with predetermined parameters across an operational range of DC link voltage.

Figure 1:
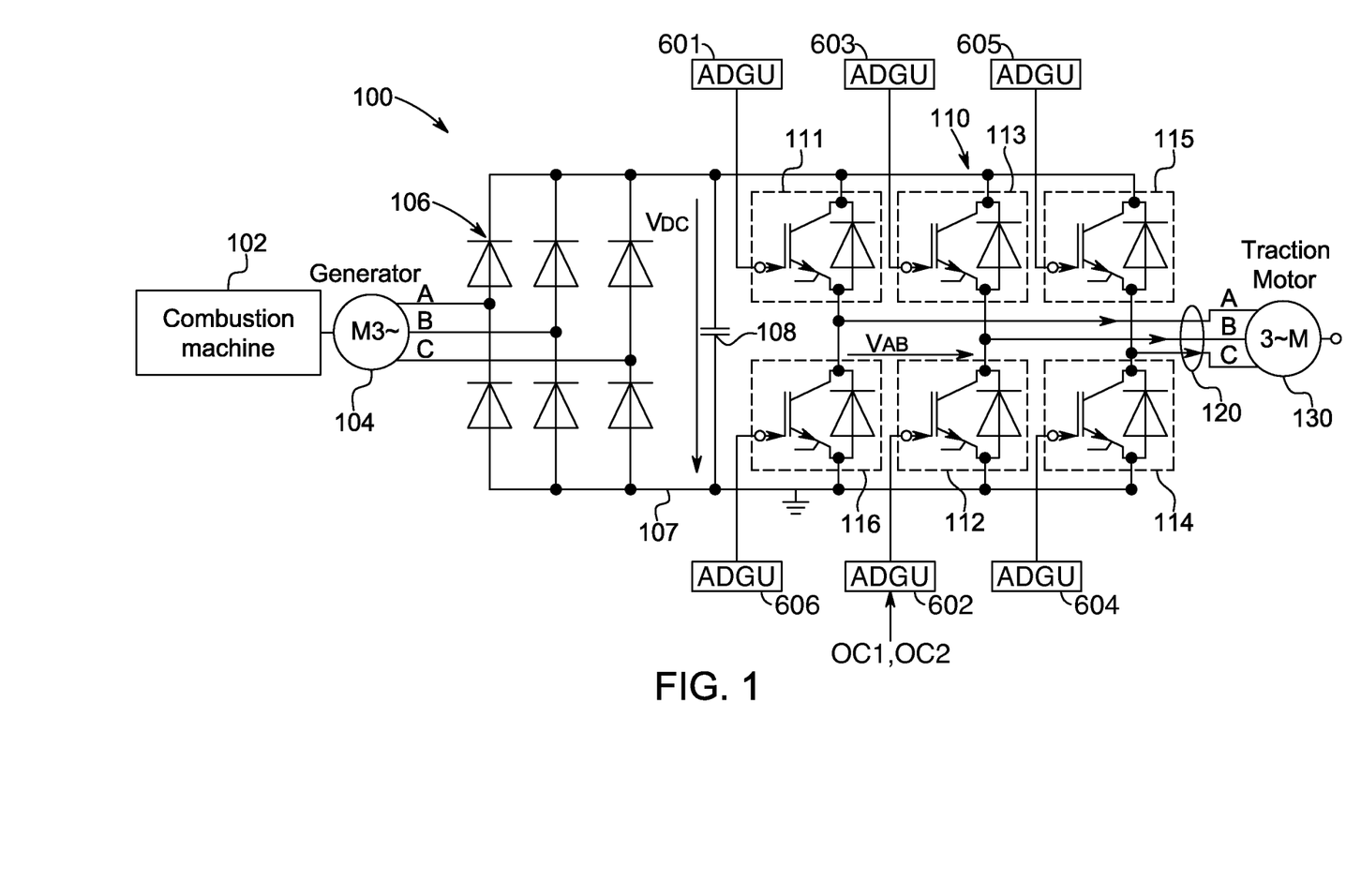
FIG. 1 is a schematic view of a diesel-electric propulsion system including a three-phase power converter, which can be controlled by a switch apparatus in accordance with an embodiment of the present invention.

FIG. 1 shows in schematic view a diesel-electric propulsion system 100, in which a combustion machine 102 (e.g., diesel or other engine) drives a three-phase generator 104. AC voltage produced by the generator 104 is rectified by a three-phase diode array 106, also referred to herein as rectifier 106, which delivers voltage Vdc to a DC link 107 connected across a capacitor 108 and a power inverter 110 or other converter ("converter" refers to a device for converting one voltage form to another, such as DC to 3-phase AC). The power inverter includes switch apparatus or "modules" 111, 112, 113, 114, 115, 116, which are controlled together to commutate Vdc to deliver three-phase electrical power via output terminals 120 to a traction motor 130 or other load. (Although a three-phase load is illustrated as an example, embodiments of the invention as applicable to other loads.) In an embodiment of the present invention, each switch apparatus is controlled by a corresponding adaptive gate drive unit (ADGU) 601, 602, 603, 604, 605, 606, as further discussed below with reference to FIG. 6.

Figure 2:
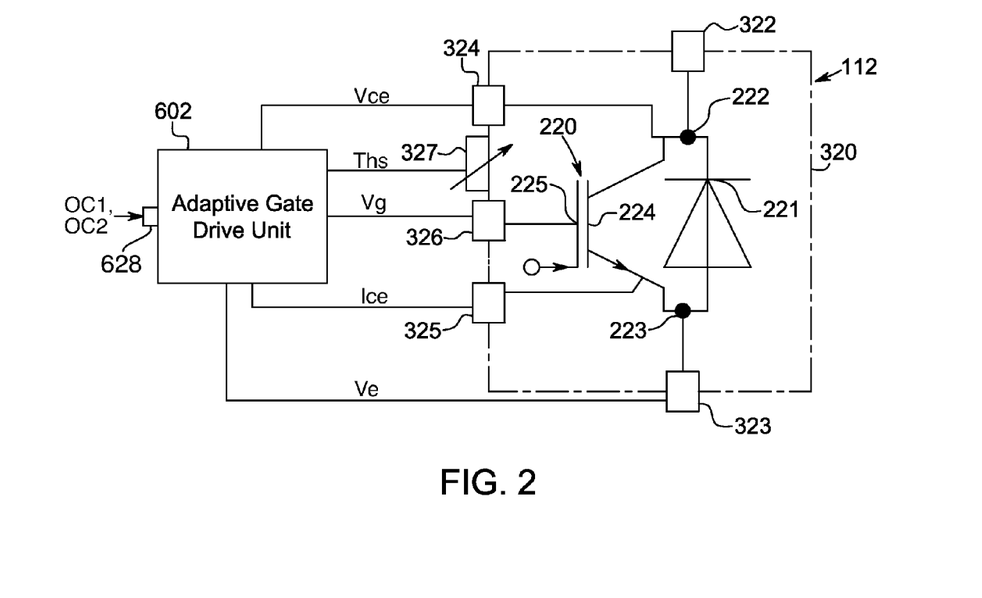
FIG. 2 is a schematic view of a switch apparatus including a semiconductor power switch and a free wheel diode in accordance with an embodiment of the present invention.
Figure 3:
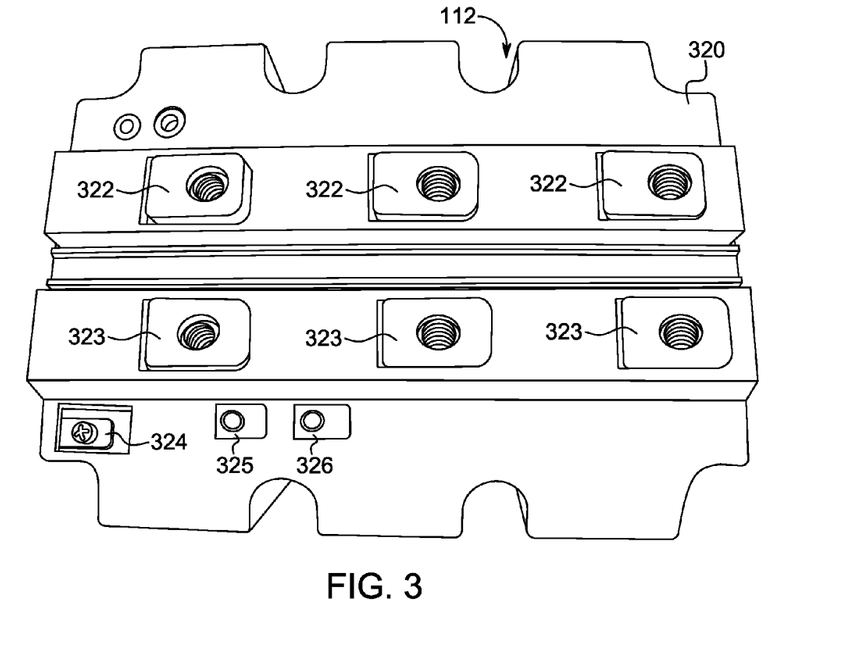
FIG. 3 is a perspective view of the switch apparatus of FIG. 2.

FIG. 2 shows in schematic view an embodiment of the switch apparatus 112. As depicted, the switch apparatus 112 includes within its case 320 (FIG. 3) a semiconductor power switch 220 and a free wheel diode 221. The semiconductor power switch 220 has a collector 222 and an emitter 223 that are joined by a junction 224. At the junction 224, a gate 225 is connected to receive gate drive voltage Vg and gate current Ige from an associated gate drive unit 602. Thus, the gate drive unit 602 acts on the open pin gate terminal of the semiconductor power switch.

It will be appreciated that the gale drive unit 602 can "drive" the gate 225 by supplying appropriate levels of voltage and/or current. When the gate is driven, the power switch 220 is in a "conducting" state with relatively small voltage drop from collector 222 to emitter 223. While the gate is not driven, the power switch typically is in a "non-conducting" or high voltage drop state, with only minimal leakage current from collector to emitter. Power converters also can be implemented using SCRs, which remain conducting until reverse biased. The free wheel diode 221 is connected anti-parallel to the semiconductor power switch 220. In other words, the anode of the free wheel diode is connected to the semiconductor power switch emitter 223, while the cathode of the free wheel diode is connected to the semiconductor collector 222. Accordingly, the free wheel diode 221 passes current to prevent imposition of breakdown voltage across the power switch in case the power switch 220 is reverse biased.

External to the switch apparatus 112, the collector 222 is connected to one of the output leads 120 and to an electrically adjacent switch apparatus 113, via a collector terminal 322 included in the switch apparatus case 320. The emitter 223 is connected to the DC link 107 at the low side of the capacitor 108 and of the rectifier 106, via an emitter terminal 323 included in the switch apparatus case 320. The adaptive gate drive unit 602 is connected to the semiconductor power switch collector 222, emitter 223, and gate 225 via sense terminals 324 and 325, and control terminal 326, respectively, as further discussed below with reference to FIG. 6. The adaptive gate drive unit 602 also is connected to a real or virtual temperature sensor. In the depicted embodiment, a real temperature sensor as a thermistor 327 is present, which could be mounted to the switch apparatus case 320 of FIG. 3 to measure switch apparatus case temperature.

Although FIG. 2 specifically illustrates an exemplary embodiment wherein the semiconductor power switch is an isolated gate bipolar transistor (IGBT), the present invention is also applicable to other solid state semiconductor devices, including, by way of non-limiting examples, bi-mode isolated gate transistors (BiGTs), MOSFETs, and other voltage controlled devices. Additionally, although typically the switch apparatus 111, 112, . . . 116 will be homogeneous, aspects of the invention can be implemented in power converters including heterogeneous power switches. Other embodiments of the invention are applicable to single power switches.

Figure 4:
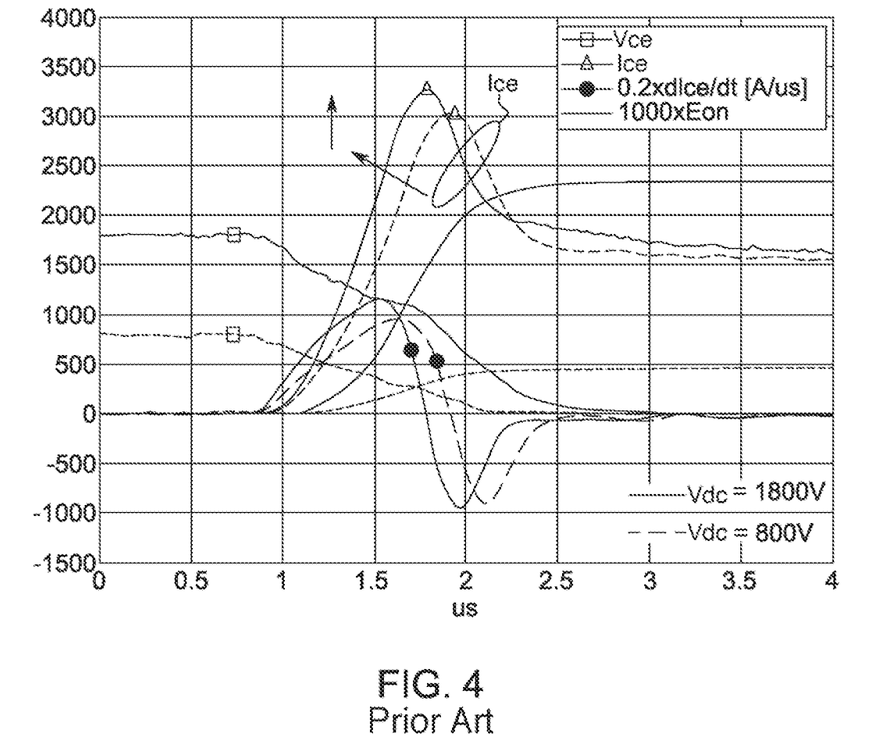
FIG. 4 shows switch ON characteristics for various values of voltage across the semiconductor power switch of FIG. 2, when controlled by a conventional gate drive unit.

FIG. 4 shows time graphs of voltage and current transients at switch ON for various values of DC link voltage across the switch apparatus 112 of FIG. 2, when controlled by a conventional gate drive unit. In particular, FIG. 4 shows transients of switch apparatus voltage drop Vice; switch apparatus power current Ice; switch apparatus power loss Eon; and current slew rate dIce/dt, for Vdc=1800V and for Vdc=800V. When comparing two different Vdc levels, an increase in voltage raises the magnitude of switch apparatus power loss and also tends to drive larger current slew rates and larger peak values of Ice during switching transients. For example, as shown in FIG. 4, the larger value Vdc=1800V produces a larger slew rate and peak value of Ice as shown by the solid line whereas the smaller value Vdc=800V produces a smaller slew rate and peak value of Ice as shown by the dashed line.

As will be appreciated, power converter operation conditions such as DC-link voltage, output current, and semiconductor power switch junction temperature can affect the switch ON and switch OFF slew rate of power current Ice. For example, at low values of DC link voltage Vdc, the switch ON slew rate of the power current Ice is decreased. At low values of semiconductor junction temperature, switch OFF slew rate in absolute value of the power current Ice substantially increases, with potentially negative effects like overvoltage. Therefore, in embodiments of the invention, for optimal utilization and safe operation of the semiconductor power switches, the power current switch ON slew rate is kept within a pre-determined slew rate envelope across a predefined range of operational parameters.

For example, switching current slew rate can be maintained within a min-max range of values throughout the switching transient. Maintaining the switching current slew rate within a min-max range of values throughout the switching transient is one example of controlling the power switch to deliver current within a pre-determined slew rate envelope. Alternatively, switching current slew rate can be maintained within a specific range of error around a desired transient time function. Maintaining the switching current slew rate within a specific range of error around a desired transient time function is another example of controlling the power switch to deliver current within a pre-determined slew rate envelope.

During switch-on or switch-off, gate drive voltage Vg is the most easily adjustable parameter affecting current slew rate dIce/dt. It has, however, been considered infeasible to adjust Vg so as to control semiconductor power current slew rate dIce/dt in a closed-loop mode, due to the prohibitively high sample rate required on Ice. Accordingly, gate drive units have conventionally been pre-set with a single target value of gate drive voltage Vg to assure safe operation at the highest design value of DC-link voltage Vdc.

At lower values of Vdc, a single-setting gate drive unit will provide inadequate gate drive voltage Vg, causing slower-than-desired switch ON of the semiconductor power switch, leading to higher-than-desired switching losses. The higher switching losses, in combination with the maximum value of Ice that occurs due to high output current at low values of Vdc, could lead to undesirable or worst case high temperature conditions at the semiconductor junction. Therefore, the conventional gate drive units require thermal and electrical over-design of the semiconductor power switches in order to provide a full range of proper operation for a single value of gate drive voltage Vg. Over-design leads to poor utilization of semiconductor power switches, except when operating in the designed worst-case condition. Such poor utilization could be significant in applications such as the diesel electric traction system 100, where DC link voltage may be strongly varied to optimize efficiency of power transfer at various loadings from full ahead to regenerative braking.

In view of the above, in embodiments of the invention, the switching slew rate of power current Ice is controlled such that semiconductor power switch parameters including junction temperature Tj can be maintained within acceptable design limits. According to one embodiment of the present invention, an adaptive gate drive unit is configured to adjust gate drive voltage for maintaining power current slew rate within a pre-determined slew rate envelope, without direct measurement of the power current slew rate. By adjusting gate drive voltage Vg, it is possible to maintain consistent current slew dIce/dt, across an operating range of Vdc.

Figure 5A:
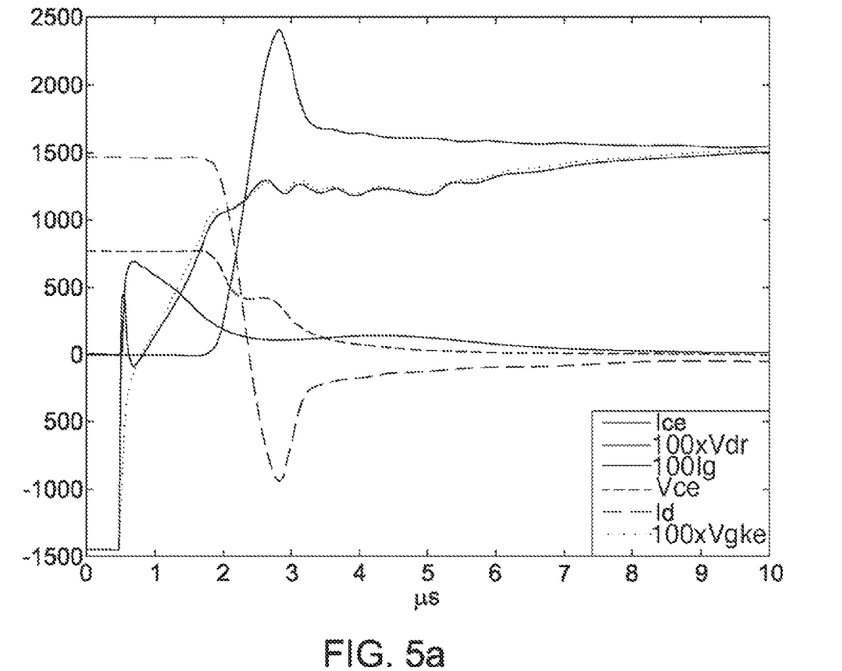
FIGS. 5A and 5B are graphs illustrating switch ON characteristics for the semiconductor power switch of FIG. 2, under single-setting gate drive voltage or under adaptive gate drive voltage control according to embodiments of the present invention.
Figure 5B:
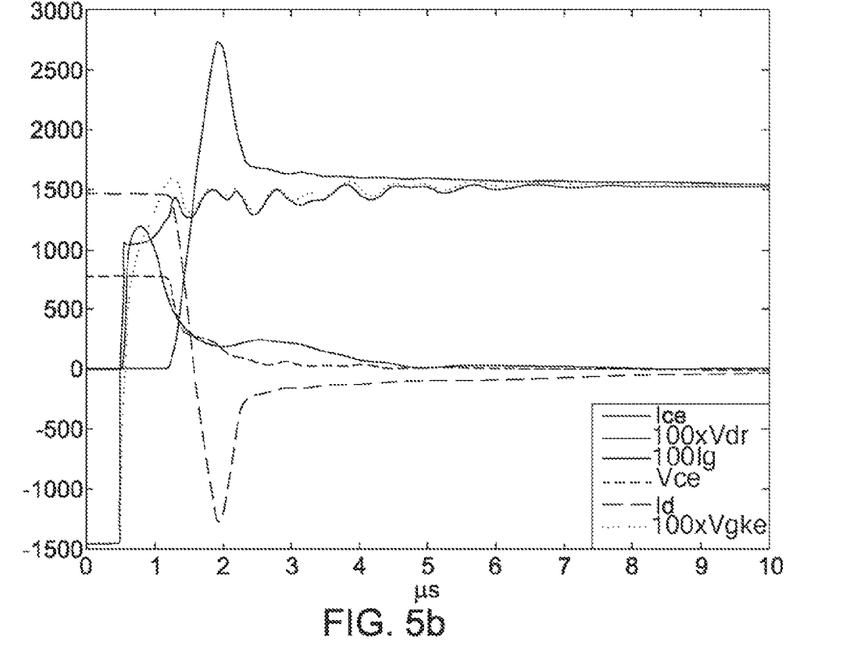

For example, FIG. 5A shows the switch ON transient of an exemplary semiconductor power switch, at 800 Vdc, forward-biased by a single-setting gate drive voltage Vg optimized for 1800 Vdc. By contrast, FIG. 5B shows the switch ON transient of the same semiconductor power switch, at 800 Vdc, forward-biased by a gate drive voltage Vg optimized for 800 Vdc. Notably, using the properly optimized gate drive voltage setting results in higher gate current Ig, increased slew rate of gate drive voltage Vg and of power current Ice, thus, enhanced performance and lower switching losses of the semiconductor power switch. Accordingly, in embodiments, multiple settings of gate drive voltage Vg are provided, optimized or otherwise selected/pre-selected for several values of Vdc within an expected operating range of DC link voltage Vdc.

Figure 6:
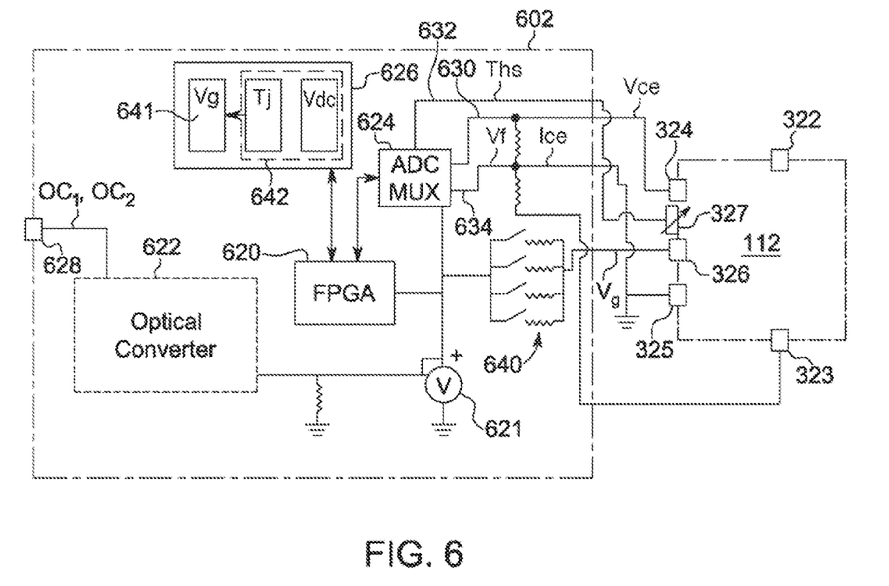
FIG. 6 is a schematic view an adaptive gate drive unit, connected with the switch apparatus shown in FIG. 2, according to an embodiment of the present invention.

Accordingly, FIG. 6 shows in schematic view an adaptive gate drive unit 602, connected with the switch apparatus 112, according to an embodiment of the present invention. The adaptive gate drive unit 602 includes a programmable logic controller (PLC) 620, which in one embodiment can be an FPGA (field programmable gate array). The gate drive unit 602 also includes a DC power supply 621, an optical converter or other control terminal 622, an ADC (analog digital signal converter) 624 ("ADC MUX"), a gate drive unit memory 626, and several signal connections. In particular, a command link 628 connected with the control terminal 622 receives and transmits data including operator control signals OC1, OC2, etc., while the PLC 620 directly receives measured values of Vce, Tj, and Ice from sensor connections 630, 632, and 634 via the ADC 624.

Based on the measured values and the received data, the PLC 620 controls an output stage 640 to deliver agate drive voltage Vg selected from a plurality of pre-determined values 641 that are stored in a lookup table 642 within the gate drive unit memory 626. In one aspect of the present invention, the stored values of Vg are pre-determined according to linear functions of Tj and Vce. In another aspect of the present invention, the stored values of Vg are pre-determined according to one or more operator control signals OC1, OC2, etc. that are received at the PLC 620 via the command link 628 and the control terminal 622. In yet another aspect of the invention, the stored values of Vg may be time sequenced arrays or time functions, each corresponding to one or more of a plurality of pre-determined ranges of one or more operating parameters, such as Tj, Vce, Vdc, and/or OC1, OC2, etc. Realizations of the variable Vg can be attained with an array of resistors connected to a single gate drive unit voltage source, as implied by the figures, or multiple voltage sources connected to a single resistors, or others. In certain embodiments, Vg is varied digitally, that is, among discrete values.

According to one aspect of the invention, the gate drive unit 602 controls the slew rate of the collector-emitter current Ice during switching transients, by controlling the slew rate of the gate drive voltage Vg according to a time function Vg(t) selected by the PLC 620 from the gate drive unit memory 626. For example, in some aspects, Vg(t) can be a function of time setting the target value of gate drive voltage Vg within a time range (e.g., 0, 10 us) and a target range (e.g., −15, 15V).

Realizations of the target value for gate drive voltage Vg can be attained with an array of resistors connected to a single gate drive unit voltage source, as implied by the figures, or multiple voltage sources connected to a single resistors, or others. For example, in the embodiment shown in FIG. 6, the voltage Vce across the power switch is measured at the gate drive unit 602, and the output stage 640 includes a programmable voltage divider that includes a plurality of resistors, which can each be switched by the PLC 620 via controlled MOSFETs or similar. The output stage 640 is then switched by the PLC 620, according to the measured voltage, to achieve a turn-on current slew rate that is independent of the DC-link voltage. Thus, for low values of DC-link voltage Vdc, the output stage 640 is switched to provide higher target values of gate drive voltage Vg. As shown in FIG. 6, the output stage 640 also includes a variable voltage source (e.g., a "variac" type of device). In other embodiments, an output stage may include one or more of a variac, a variable current source, or a programmable voltage divider.

Still referring to FIG. 6, target values 641, which correspond to pre-determined ranges of DC-link voltage Vdc, are stored in a lookup table 642 in the gate drive unit memory 626. The PLC 620, which can be in one embodiment an FPGA, reads a measurement of power switch voltage Vce, searches the corresponding Vdc range within the lookup table, selects the appropriate Vg value, and sends command signals to the output stage 640 to get the optimal driving strength Vg for the next switching event. "Corresponding Vdc range" means a range of values for Vdc that have been identified during switch precommissioning, or during other non-fault baselining operation, as corresponding with the measured value of Vce.

In another embodiment, not shown, the three-phase output current supplied from the power converter 110 to the traction motor 130 can be measured or estimated at each of the adaptive gate drive units 601 . . . 606, and each PLC can adapt or vary gate drive voltage Vg as a time function to achieve a turn-on current slew rate dIce/dt independent of target output current Ice. In other embodiments, the junction temperature Tj of the semiconductor power switch can be measured or estimated, and the driving strength can be adapted to achieve a turn-on current slew rate independent of temperature. In yet another embodiment, an operation condition, such as load current or an operator control input, can be measured at a central control unit (not shown), which can select and communicate to the adaptive gate drive unit a control signal for selecting an appropriate value of gate drive voltage Vg.

Figure 7:
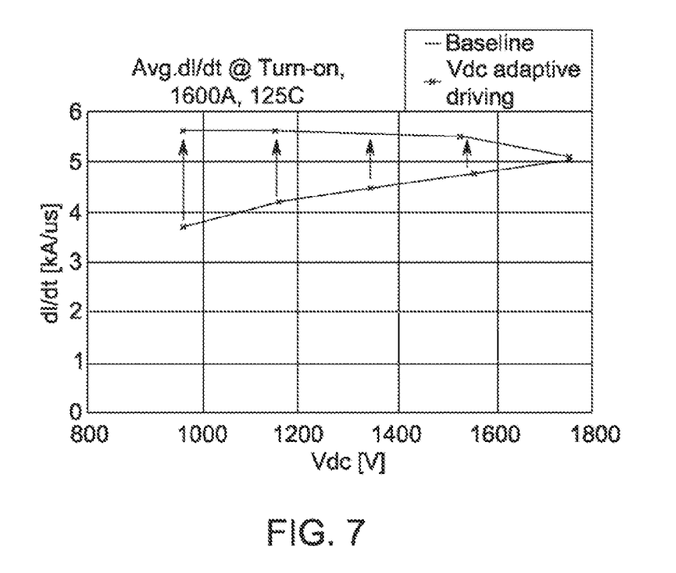
FIGS. 7-9 are graphs depicting comparative switching characteristics within operating ranges of various semiconductor power switch parameters, according to embodiments of the present invention.

FIG. 7 shows paired graphs of average values of switch-on current slew rate dIce/dt, across an operating range of supply voltage Vdc. The upper curve shows the results from use an adaptive gate drive unit to provide pre-selected values of Vg, according to one aspect of the present invention. The lower curve shows the results from use of a conventional gate drive unit. It will be noted that increasing Vg as Vdc decreases, acts to accelerate the current slew rate dIce/dt resulting in a substantially flat function of dIce/dt relative to Vdc. This is by contrast to the marked upward slope of the conventional non-adaptive (single setting) gate drive unit.

Figure 8:
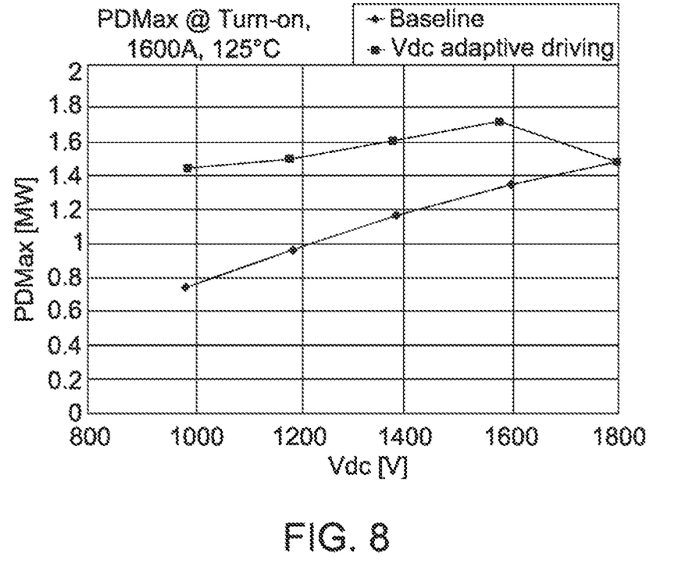

A similar effect is seen in FIG. 8, which shows paired graphs of peak power PD at the free wheel diode, across the same operating range of DC link voltage Vdc. The lower line with marked upward slope is for a baseline case with Vg held at a single value, while the upper generally flat line illustrates an aspect of the invention wherein Vg is adjusted according to Vdc.

Figure 9:
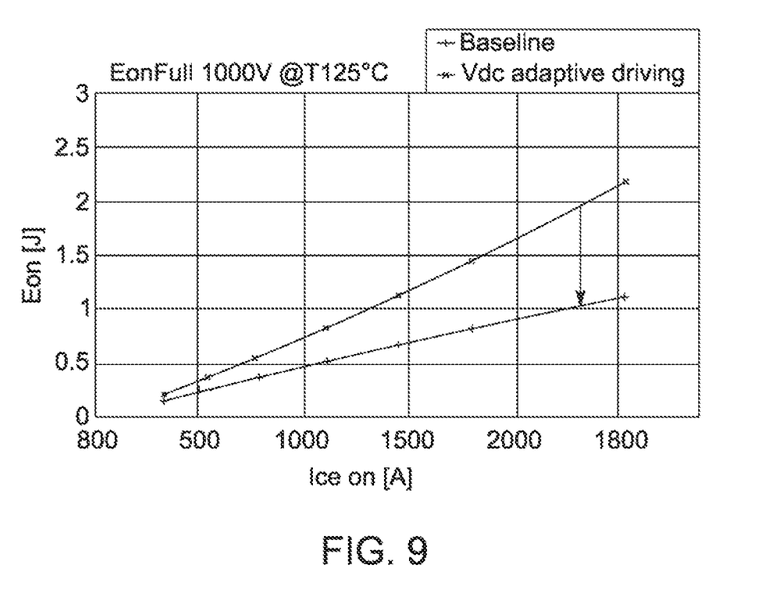

Thus, by adapting Vg, an adaptive gate drive unit according to an embodiment of the present invention can level out thermal and electrical stresses throughout an operating range of DC link voltage, thereby reducing thermal fatigue of semiconductor power switches that are controlled by the inventive gate drive unit. For example, FIG. 9 shows variation of switching loss energy Eon across the semiconductor power switch/free wheel diode module, throughout an operating regime of switch-on current, both for a baseline case with single-setting gate drive voltage Vg and for a case where gate drive voltage is adapted according to an aspect of the present invention. It can be seen that by adapting gate drive voltage Vg, according to one aspect of the present invention, switching losses can be reduced, thereby mitigating heat load and thermal stress on the semiconductor power switch. Additionally, semiconductor power switch junction temperature Tj can be controlled within design limits, by adapting gate drive voltage Vg.

Thus, according to aspects of the present invention, an adaptive gate drive unit can mitigate over-design of semiconductor power switches for use in a power inverter or power converter, as used for example in the diesel electric traction system 100 shown in FIG. 1.

In one embodiment, a switch apparatus includes a semiconductor power switch connected for delivering current while the semiconductor power switch is driven by a gate drive voltage, and an adaptive gate drive unit connected to a gate of the semiconductor power switch. The gate drive unit is configured to select one of a plurality of pre-determined time functions for a gate drive voltage, and to deliver the gate drive voltage to the gate of the power semi-conductor according to the selected time function. Thus, the gate drive unit drives the semiconductor power switch to deliver current within a pre-determined slew rate envelope.

In another embodiment, an adaptive gate drive unit includes a control terminal; a logic circuit; and an output stage that is configured to provide a gate drive voltage to a semiconductor power switch. The logic circuit is configured to select a time function, based on a control signal received via the control terminal. The logic circuit is further configured to control the output stage to provide the gate drive voltage, according to the selected time function.

In certain aspects and embodiments, the time function may be selected based on a measurement of voltage between a collector and an emitter of a semiconductor power switch, with the semiconductor power switch in a non-conducting state. In other aspects or embodiments, the time function may be selected based on a measurement of switch apparatus case temperature, or based on an estimate of semiconductor power switch junction temperature. The power switch junction temperature may be estimated based at least on measured values of power switch electrical parameters. Also, the power switch junction temperature may be estimated based at least on a switch apparatus case temperature. In certain embodiments, the time function may be selected based on a value of a power converter output current. For example, the power converter output current can be measured or estimated with the semiconductor power switch in a non-conducting state. Also, the power converter output current may be estimated based on an operator control signal received at the gate drive unit. In some embodiments, the time function may be selected while the semiconductor power switch is in a non-conducting state, based on an estimate of the power switch current after switching.

In embodiments of the invention, a gate drive unit receives a control signal, and adjusts gate drive voltage provided by the gate drive unit to a semiconductor power switch, based on the control signal, thereby maintaining a current slew rate across the semiconductor power switch within a pre-defined slew rate envelope, without direct measurement of the current slew rate. For example, the control signal may be based on a measured value of voltage between a collector and an emitter of the semiconductor power switch in a non-conducting state. Adjusting the gate drive voltage may include selecting a time function based on the control signal, and adjusting the gate drive voltage based on the selected time function. In selected embodiments, the control signal may instead or also be based on a measurement or an estimate of a power switch junction temperature. For example, the power switch junction temperature may be estimated based on measured values of a switch apparatus case temperature and of power switch electrical parameters. In certain embodiments, the control signal may instead or also be based on a value of a power converter output current, measured or estimated with the semiconductor power switch in a non-conducting state.

Another embodiment of a switch apparatus comprises a semiconductor power switch connected to a DC link, and a gate drive unit. The gate drive unit is connected to a gate of the semiconductor power switch. For at least some different DC link voltages of the DC link, the gate drive unit is configured to deliver different gate drive voltages to a gate of the semiconductor power switch, to drive the semiconductor power switch to deliver current from the DC link to a load. In one embodiment, the switch apparatus further comprises a memory unit storing information of plural DC link voltages, which are different from one another within a designated DC link operating range (e.g., plural non-zero voltage values within a range from a first non-zero DC link voltage to a second, different non-zero DC link voltage). Respectively associated with the plural DC link voltages in the memory unit are plural gate drive voltages, at least some of which are different from one another. That is, for a given first and second DC link voltages, the gate drive voltages associated with both in the memory unit may be the same, but among all the DC link voltages, at least some of the gate drive voltages are different. The gate drive voltages may be absolute voltage levels (e.g., for turning the semiconductor power switch to an on state, during a designated time of operation when the semiconductor power switch is to be powered on, the gate drive voltage is at a level V), or time varying voltage levels (e.g., during a designated time of operation when the semiconductor power switch is to be powered on, the gate drive voltage is driven to plural different designated voltage levels). In operation, the gate drive unit receives information of the current/present, first value of the DC link voltage. Based on the current, first value of the DC link voltage, the gate drive unit identifies a first gate drive voltage that is associated/correlated with the current, first value of the DC link voltage in the memory unit. The gate drive unit delivers the first gate drive voltage to the gate of the semiconductor power switch. If the DC link voltage changes (by any amount, or, alternatively, by more than a threshold) to a second value, the gate drive unit identifies a second gate drive voltage that is associated/correlated with the second value of the DC link voltage in the memory unit, and controls driving the gate to the second gate drive voltage. At least in some instances, the second gate drive voltage is different than the first gate drive voltage. In embodiments, selection of gate drive voltage is further based on voltages (e.g., Vce) or other operational parameters associated with the semiconductor power switch, e.g., Vce may be correlated to DC link voltage.

In another embodiment, the gate drive unit is configured to deliver selected gate drive voltages to the semiconductor power switch to drive the semiconductor power switch to deliver current within a pre-determined slew rate envelope.

In another embodiment, a switch apparatus comprises a semiconductor power switch connected to a DC link, and a gate drive unit. The gate drive unit is connected to a gate of the semiconductor power switch. The gate drive unit is configured to deliver a selected one of a plurality of gate drive voltages to a gate of the semiconductor power switch. The plurality of gate drive voltages (i) are different from one another, and (ii) when any of the plurality of gage drive voltages is applied to the gate, it drives the semiconductor power switch to deliver current to a load. The gate drive unit is configured to select the selected one of the plurality of gate drive voltages based on a current/present DC link voltage of the DC link. The plurality of gate drive voltages are respectively associated (e.g., in a memory unit) with a plurality of DC link voltages within a designated range of operation of the DC link.

Thus, aspects of the invention relate to a method comprising receiving a control signal at a gate drive unit, and adjusting a gate drive voltage based on the control signal. The gate drive voltage is provided by the gate drive unit to a semiconductor power switch to maintain a switching current slew rate of the semiconductor power switch within a pre-defined slew rate envelope. The gate drive unit is adjusted based on the control signal, without direct measurement of the switching current slew rate. In certain aspects, the control signal is based on a measured value of voltage between a collector and an emitter of the semiconductor power switch in a non-conducting state, and adjusting the gate drive voltage includes selecting a time function based on the control signal and adjusting the gate drive voltage according to the selected time function.

In some aspects, the control signal is based on at least one of a measurement or an estimate of a power switch junction temperature of the semiconductor power switch. For example, the power switch junction temperature is estimated based on measured values of a case temperature of a case that houses the semiconductor power switch and of power switch electrical parameters of the semiconductor power switch.

In some aspects, the control signal is based on at least one of a measured or estimated value of a power converter output current of a power converter that includes the semiconductor power switch. The value of the power converter output current may be measured while the semiconductor power switch is in a non-conducting state. Alternatively or additionally, the value of the power converter output current is estimated with the semiconductor power switch in a non-conducting state, based on an operator control signal received at a controller separate from the gate drive unit.

As will be readily appreciated, embodiments and aspects of the present invention enable enhanced performance of a semiconductor power switch across a range of operating conditions. In particular, by adapting gate drive voltage according to operational parameters of a semiconductor power switch, it is possible to maintain switching current slew rates within a pre-defined slew rate envelope. As a result, commutation losses are reduced and thermal stress is mitigated. Accordingly, durability and power efficiency of a power converter can be enhanced.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. §122, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice the embodiments of invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal languages of the claims.

As used herein, an element or step recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above described adaptive gate drive unit, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A switch apparatus comprising:
a semiconductor power switch connected for delivering a current while driven by a gate drive voltage; and a gate drive unit connected to a gate of the power switch, the gate drive unit configured to pre-select, while the power switch is not delivering current, one of a plurality of pre-determined time functions for the gate drive voltage, and configured to subsequently deliver the gate drive voltage to the gate of the power switch according to the pre-selected time function, in order to drive the power switch to deliver said current within a pre-determined slew rate envelope, wherein the pre-selected time function is selected based on an estimated value of an output current of a power converter that includes the power switch, which value is estimated based on an operator control signal received at the gate drive unit.

2. A switch apparatus as claimed in claim 1, wherein the pre-selected time function is selected based on a measurement of voltage between a collector and an emitter of the power switch, prior to switching on the semiconductor power switch.

3. A switch apparatus as claimed in claim 1, wherein the pre-selected time function is selected based on at least one of a measurement or estimate of a power switch junction temperature of the power switch.

4. A switch apparatus as claimed in claim 3, wherein the power switch junction temperature is estimated based on measured values of power switch electrical parameters of the power switch.

5. A switch apparatus as claimed in claim 3, wherein the semiconductor power switch junction temperature is estimated based on a switch apparatus case temperature of a switch apparatus case that houses the power switch.

6. A method comprising:
receiving a control signal at the gate drive unit;
based on the value of the received control signal, adjusting a gate drive voltage provided by the gate drive unit to a semiconductor power switch for maintaining a switching current slew rate of the semiconductor power switch within a pre-defined slew rate envelope, without contemporaneous measurement of the switching current slew rate,
wherein the control signal is based on an estimated value of a power converter output current of a power converter that includes the semiconductor power switch, and the value of the power converter output current is estimated with the semiconductor power switch in a non-conducting state, based on an operator control signal received at a controller separate from the gate drive unit.

7. The method as claimed in claim 6, wherein the control signal is based on at least one of a measurement or an estimate of a power switch junction temperature of the semiconductor power switch.

8. The method as claimed in claim 7, wherein the power switch junction temperature is estimated based on measured values of a case temperature of a case that houses the semiconductor power switch and of power switch electrical parameters of the semiconductor power switch.

* * * * *